United States Patent [19]

Ernst

[11] Patent Number: 4,914,404
[45] Date of Patent: Apr. 3, 1990

[54] METHOD FOR SYNCHRONIZATION OF A SIGNAL FREQUENCY TO INTERFERENCE-PRONE REFERENCE SIGNAL FREQUENCIES

[75] Inventor: Wolfram Ernst, Munich, Fed. Rep. of Germany

[73] Assignee: Siemens Aktiengesellschaft, Berlin and Munich, Fed. Rep. of Germany

[21] Appl. No.: 358,978

[22] Filed: May 26, 1989

[30] Foreign Application Priority Data

Aug. 2, 1988 [DE] Fed. Rep. of Germany ....... 3826249

[51] Int. Cl.$^4$ .............................................. H03L 7/00
[52] U.S. Cl. ......................................... 331/11; 331/25
[58] Field of Search ....................... 331/10, 11, 14, 18, 331/25

[56] References Cited

U.S. PATENT DOCUMENTS 4,511,859 4/1985 Dombrowski ........................ 331/11

Primary Examiner—Eugene R. LaRoche
Assistant Examiner—Robert J. Pascal
Attorney, Agent, or Firm—Lawrence C. Edelman

[57] ABSTRACT

Process for synchronization of a frequency to an interference-prone reference frequency. Loss of the steady-state phase relationship between frequency and reference frequency which is maintained during the control process because of either phase shifts or necessary switching to another reference frequency causes a permanent phase deviation (random walk) in some cases because of the interference-prone reference frequencies until the steady-state phase relationship is restored. In order to prevent random walk or to avoid having to terminate the phase relationship, initially an offset value is generated by the microprocessor upon occurrence of a phase shift which exceeds a predetermined threshold and prevents the effect of the phase shift on the control process, and secondly, each reference frequency is assigned its own phase discriminator by means of which the trend in the phase relationship of the frequency in comparison with each reference frequency is known by the microprocessor, so that the microprocessor can take suitable control measures in the event it is necessary to switch to a different reference frequency.

5 Claims, 2 Drawing Sheets

METHOD FOR SYNCHRONIZATION OF A SIGNAL FREQUENCY TO INTERFERENCE-PRONE REFERENCE SIGNAL FREQUENCIES

BACKGROUND OF THE INVENTION

1. Field of the Invention

This invention concerns a process for synchronization to an interference prone reference signal frequency.

2. Description of the Prior Art

According to CCITT recommendation G.811, international digital communications connections should be operated with a long-term relative signal frequency deviation of less than $1 \times 10^{-11}$, which corresponds to a drift of approximately one frame in 70 days. In plesiochronic operation, i.e., "free running" operation, this frequency constancy can be achieved only with expensive cesium atomic frequency standards.

In order to be able to maintain the recommended frequency constancy even in the national network, an economically and technologically favorable solution is a synchronous digital system whereby the clock signal generators of the exchange (starting from a central reference or standard clock source) are synchronized to a reference signal frequency $f_R$, which is transmitted, for example, from one network center of the same or higher order over an existing digital signal connection with this network center. In the event of an interruption in such a connection, the reference signal frequency is supplied on an alternative route from another one of these network centers.

It is known that a digital phase control circuit according to FIG. 1 can be used for such synchronization. The design and function of this control circuit are described here briefly.

The signal frequency $f_s$ of an exchange was divided down by a frequency divider FDS and is optionally synchronized to one of two reference frequencies $f_{R0}$ or $f_{R1}$, which are supplied from different exchanges of the same or higher order as explained elsewhere.

Depending on the switch position of a reversing switch $S_u$, one of the two reference frequencies is applied to the first input of a phase discriminator PD as a standardized input frequency $f_i$ by way of the frequency dividers FD0 and FD1. The second input receives the reference frequency $f_0$, which is derived via a loop counter LC from the output frequency $f_n$ of a voltage controlled oscillator VCO that is acted on by the frequency divider FDS to generate $f_s$.

In accordance with the control algorithm of the processing unit (microprocessor) MP a control value is calculated from the phase difference between the two frequencies $f_i$ and $f_0$ and is sent as the control voltage to the voltage controlled oscillator (VCO) by way of a digital-analog converter DAC.

The jitter and drift disturbances superimposed on the reference frequencies are treated in accordance with CCITT recommendation Q 502, i.e., high-frequency jitter disturbances are damped according to a low pass characteristic, whereas drift disturbances (daily drift) are relayed.

When it is necessary to switch to a different reference frequency (e.g., from $f_{R0}$ to $f_{R1}$) or in the event of sudden phase shifts in the input frequency $f_i$ (without switching), the loop counter LC is reset by a phase correction PC, so the instantaneous phase difference at the input of the phase discriminator is set at zero. The reset time is selected so it coincides with a change in edge (trailing or leading) of the input frequency $f_i$. This should prevent unnecessary frequency changes in the oscillator due to correction of the phase shift.

However, this measure also results in simultaneous loss of the original phase relationship between the input frequency $f_i$ and the reference frequency $f_o$ which was established on the basis of the preceding control process. After resetting loop counter LC, this steady-state phase relationship can be gradually restored (according to the time constants of the phase control circuit) but interference processes (e.g., jitter, drift, aging) during the transition phase and up until restoration of the steady-state relationship can cause a permanent phase deviation. Even phase deviations (jitter) that would be reset back to their steady-state level after the transition phase become permanent phase deviations when it is necessary to reset the loop counter within this period of time.

In contrast with the case described previously, there is no relationship between the phase position of the signal frequency or the reference frequency $f_o$ and the phase of the new reference frequency before the resetting which is necessitated by the switching. In the worst case, this results in an accumulation of the phase deviation as shown in to FIG. 2.

It is assumed in FIG. 2 that the two reference frequencies $f_{R0}$ and $f_{R1}$ involved in the switching U have periodic phase deviations $\Delta R_{R0}$ and $\Delta W_{R1}$ in comparison with the normal frequency which are exactly opposite each other due to drift. If switching is performed precisely at the times $t_0$, $t_1$, $t_2$, and $t_3$ of the maximum phase deviation, the oscillator will oscillate constantly at a somewhat increased frequency $f_n$, so the phase deviation $\Delta W_s$ of the signal frequency $f_s$ is increased steadily in comparison with the normal frequency.

Statistically, the accumulation of phase deviation $\Delta W_s$ due to the resetting processes can be described by the random walk model. In this model each resetting process is interpreted as an interference event with an average frequency h and a permanent average phase deviation $\pm \Delta W_s$. The standard deviation $\epsilon$ of the phase deviation $\Delta W_s$ is then obtained according to the following equation, where the parameter t characterizes the time.

$$\sigma = 1/2 \times \Delta w_s \times \sqrt{h \times t}$$

An object of the present invention is to reduce the random walk of the phase and the network.

SUMMARY OF THE INVENTION

In order to prevent random walk or to avoid having to terminate the phase relationship, initially an offset value is generated by the microprocessor upon occurrence of a phase shift which exceeds a predetermined threshold and prevents the effect of the phase shift on the control process, and secondly, each reference frequency is assigned its own phase discriminator by means of which the trend in the phase relationship of the frequency in comparison with each reference frequency is known by the microprocessor, so that the microprocessor can take suitable control measures in the event it is necessary to switch to a different reference frequency.

Other features and advantages of the invention will be apparent from the description of the preferred embodiment, and from the claims.

For a fuller understanding of the present invention, reference should now be made to the following detailed description of the preferred embodiment of the invention and to the accompanying drawing.

DETAILED DESCRIPTION OF THE PREFERRED EMBODIMENTS

Figure 1:
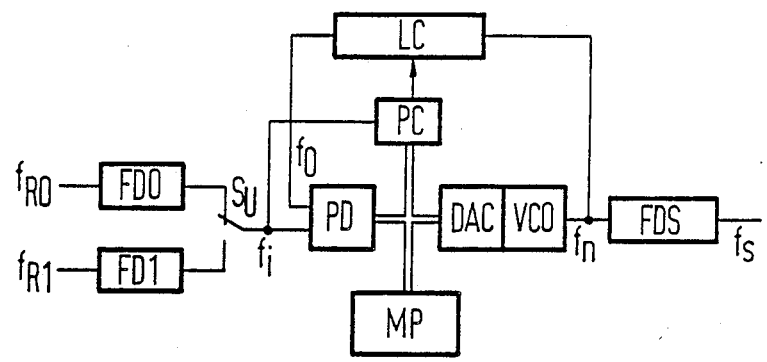
FIGS. 1 and 2 show a phase synchronization circuit already described.
Figure 3:
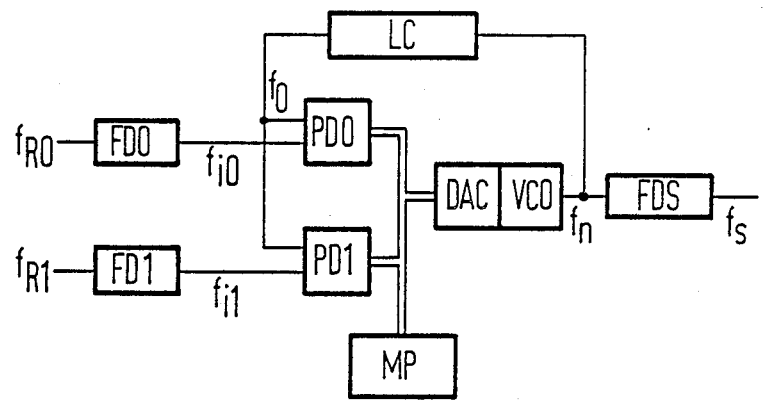
FIG. 3 shows a phase synchronization circuit constructed according to the principles of the invention.

FIG. 3 shows a digital phase control circuit where the signal frequency $f_s$, which was divided down by the frequency divider FDS, is to be synchronized to either one of two reference frequencies $f_{R0}$ and $f_{R1}$.

Each of the two reference frequencies is assigned its own phase discriminator PD0 or PD1 by way of frequency dividers FD0 and FD1.

The second input signal of the two phase discriminators, the frequency $f_o$, is supplied by a loop counter LC which is in the feedback loop of the phase control circuit and divides the frequency $f_n$ provided by the voltage controlled oscillator VCO. A microprocessor MP that represents the processing unit receives the output signals (phase differences) of the two phase discriminators and stores these data for a certain period of time (several control periods). Thus, the instantaneous phase relationship between the two reference frequencies $f_{R0}$ and $f_{R1}$ and the signal frequency $f_s$ is known and their history is also known. By analyzing these data, certain characteristic values can be determined, such as the maximums/minimums of the phase difference, the time interval of the reversal points or the instantaneous values of the phase deviations and their directions. On the basis of such characteristics and suitable computation procedures, the microprocessor calculates a control value which it sends to a digital-analog converter DAC. The digital-analog converter DAC in turn converts the digital control value received from the microprocessor MP to an analog control value for the oscillator VCO.

In determining the control value the microprocessor takes into account the following factors: If the microprocessor recognizes a sudden phase shift, e.g., by comparison of the difference between two chronologically successive phase relationships received from the phase discriminator with a predetermined threshold value, it will correct the control value determined with the help of the conventional computation rules by means of a corresponding offset value so that unnecessary correction of the phase difference is suppressed.

In most cases, phase shifts in one direction are compensated by phase shifts in the opposite direction. Only if the phase deviation that occurs as a result of phase shifts has become so great that there is the danger of frame drift does the microprocessor become operative in a control function. Formation of the above-mentioned offset value eliminates the need for the above-mentioned resetting process which would result in a loss of a phase relationship and thus would cause a permanent phase shift as explained above.

The foregoing also holds true in the case of switching from one reference frequency to another. The microprocessor stores the chronological sequence of phase relationships of the signal frequency in comparison with the new reference frequency before switching.

Figure 2:
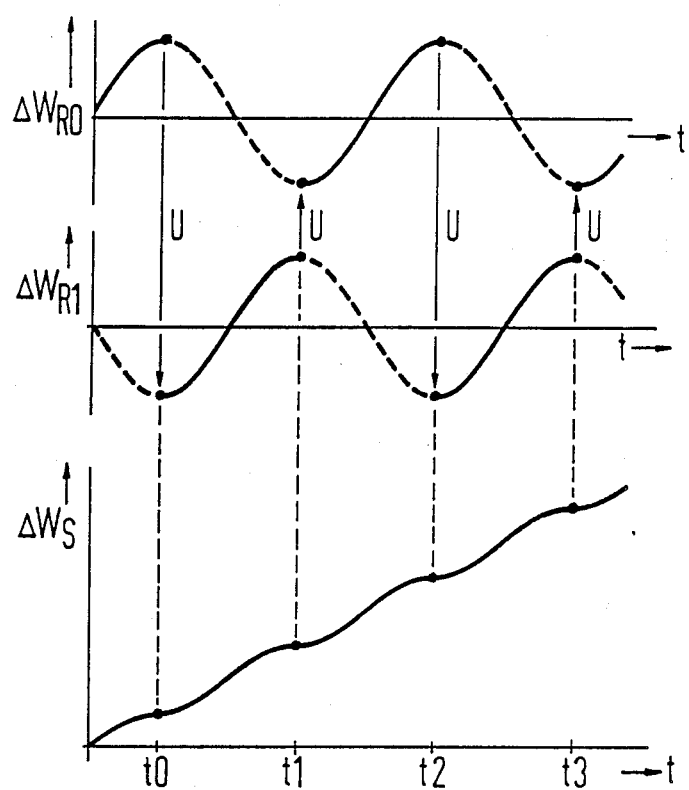

With the help of suitable computation procedures it is possible to determine from this the amount of the instantaneous phase difference that can be attributed to phase shifts and the amount that can be attributed to drift effects and other effects (jitter, frequency drift). Accordingly, the microprocessor forms offset values with regard to phase shifts, and it generates correction values with regard to drift, so that accumulation of the phase deviation, as, for example, in FIG. 2, is largely prevented.

Thus, there has been shown and described a novel method for synchronization of a clock signal generator which fulfills all the objects and advantages sought therefore. Many changes, modifications, variations and other uses and applications of the subject invention will, however, become apparent to those skilled in the art after considering this specification and the accompanying drawings which disclose a preferred embodiment thereof. All such changes, modifications, variations and other uses and applications which do not depart from the spirit and scope of the invention are deemed to be covered by the invention which is limited only by the claims which follow.

I claim:

1. A method for synchronizing a signal frequency generated by a signal frequency generator to an interference-prone reference signal frequency of one of several reference frequency signal generators that are available and are independent of each other and supply approximately the same frequency, using a digital phase control circuit which is controlled by a processing unit (MP) that supplies control values to the oscillator (VCO) of the phase control circuit, comprising the following steps:

(a) assigning each reference signal frequency ($f_{R0}$, $f_{R1}$) its own phase discriminator (PD0, PD1);
    (b) determining for each phase discriminator the value of the phase relationship between the reference signal frequency and the signal frequency generated by the signal frequency generator and relaying it to the processing unit for storage;
    (c) when there are sudden phase shifts exceeding a predetermined threshold value, the processing unit determines a control value which contains an offset value by means of which correction of these phase shifts is prevented; and
    (d) when switching to a different reference signal frequency, the processing unit controls the setting at this reference signal frequency on the basis of the data supplied by the respective phase discriminator before switching, and this is done by means of appropriate correction of the control value in the sense that an accumulation of the phase deviation between the reference signal frequency and the signal frequency of the signal frequency generator is largely prevented.

2. A method according to claim 1, wherein the processing unit (MP) determines a control value only when switching is required with respect to at least one of the remaining reference signal frequencies (e.g., $f_{R1}$).

3. A method according to claim 1, wherein the processing unit (MP) determines control values continuously with respect to each of the remaining reference signal frequencies.

4. A method according to claim 2, wherein the processing unit (MP) performs the selection of a reference signal frequency from the remaining reference signal frequencies on the basis of the aforementioned control values.

5. A method according to claim 3, wherein the processing unit (MP) performs the selection of a reference signal frequency from the remaining reference signal frequencies on the basis of the aforementioned control values.

* * * * *